United States Patent
Lv et al.

(10) Patent No.: US 9,984,642 B2
(45) Date of Patent: May 29, 2018

(54) SHIFT REGISTER, DRIVING METHOD THEREOF, GATE DRIVER CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Lei Lv, Beijing (CN); Fei Xu, Beijing (CN); Jun Hong, Beijing (CN); Jie Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days. days.

(21) Appl. No.: 15/538,932

(22) PCT Filed: May 11, 2016

(86) PCT No.: PCT/CN2016/081699
§ 371 (c)(1),
(2) Date: Jun. 22, 2017

(87) PCT Pub. No.: WO2017/133117
PCT Pub. Date: Aug. 10, 2017

(65) Prior Publication Data
US 2018/0082652 A1  Mar. 22, 2018

(30) Foreign Application Priority Data

Feb. 4, 2016  (CN) .......................... 2016 1 0078430

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0286* (2013.01); *G09G 2310/08* (2013.01); *G09G 2330/021* (2013.01)

(58) Field of Classification Search
CPC .............. G11C 27/04; G09G 2310/08; G09G 2310/0286
See application file for complete search history.

(56) References Cited

FOREIGN PATENT DOCUMENTS

| CN | 102708799 A | 10/2012 |
|----|-------------|---------|
| CN | 104966506 A | 10/2015 |

(Continued)

OTHER PUBLICATIONS

The International Search Report and Written Opinion dated Nov. 3, 2016; PCT/CN2016/081699.

(Continued)

*Primary Examiner* — Michael Faragalla
*Assistant Examiner* — Chayce Bibbee
(74) *Attorney, Agent, or Firm* — Ladas & Parry LLP (57) ABSTRACT

A shift register, a driving method thereof, a gate driver circuit and a display device. The shift register includes: a precharge module, a reset module, a control module, a first pull-up module, a second pull-up module, a first pull-down module and a second pull-down module. The present disclosure can adopt one shift register to drive two rows of gate lines, reduce the number of transistors, reduce the circuit cost, eliminate the noise at output ends of the shift registers, and improve the operation stability.

18 Claims, 6 Drawing Sheets

(56) References Cited

FOREIGN PATENT DOCUMENTS

| CN | 105529009 A | 4/2016 |
|---|---|---|
| KR | 1020060097819 A | 9/2006 |

OTHER PUBLICATIONS

The First Chinese Office Action dated Jul. 28, 2017; Appln. No. 201610078430.4.

SHIFT REGISTER, DRIVING METHOD THEREOF, GATE DRIVER CIRCUIT AND DISPLAY DEVICE

TECHNICAL FIELD

The present disclosure relates to a shift register, a driving method thereof, a gate driver circuit and a display device.

BACKGROUND

Thin-film transistor liquid crystal displays (TFT-LCDs) are widely applied in various fields of production and life and adopt a progressive scanning matrix, arranged by M*N points, for display. In the case of display, the TFT-LCD adopts a driver circuit to drive pixels in a display panel for display. The driver circuit of the TFT-LCD mainly includes a gate driver circuit and a data driver circuit. Wherein, the data driver circuit is configured to sequentially latch inputted data according to clock signal timing, convert the latched data into analog signals, and input the analog signals into data lines of a display panel. The gate driver circuit is generally implemented by a shift register. The shift register converts clock signals into on/off voltage which is respectively outputted to gate lines of a display panel. One gate line on the display panel is generally butted with one shift register (namely one stage of the shift registers). The progressive scanning of pixels in the display panel is achieved by adoption of the shift registers to sequentially output the on voltage. According to the scanning direction, the progressive scanning of the pixels may be divided into single-direction scanning and bilateral scanning. Currently, in mobile products, in view of the improvement of the productivity and the yield of the mobile products, bilateral scanning is usually required to be realized.

As the mobile products such as mobile phones and tablet PCs are more and more light and thin and refined, narrow bezel becomes the development trend. In the traditional gate driver circuit, one-stage circuit can only drive one row of gate lines. The development of a circuit with less number of thin-film transistors (TFTs) has a very important significance on the realization of ultra narrow bezel (UNB).

On the other hand, with the development of flat-panel display, high resolution and narrow bezel become the development trend. Gate driver on array (GOA) technology emerges for this trend. In the GOA technology, a gate driver circuit of a TFT-LCD is integrated onto an array substrate to replace a driver chip bonded to an outer edge of a panel and made from a silicon chip. As the driver circuit may be directly disposed on the array substrate in the technology, an integrated circuit (IC) and wirings are not required to be bonded at the periphery of the panel, so the manufacturing process of the panel can be reduced and the production cost can be saved. Meanwhile, the integration of the TFT-LCD panel can be improved, so that the panel can achieve narrow bezel and high resolution. But the GOA technology has the inherent problems of service life, etc. In GOA design of actual products, the key problems in GOA design are how to achieve the shift register function with less circuit elements, and the reduction of the noise at output ends to ensure the long-term stable operation of the gate driver circuit.

SUMMARY

The present disclosure provides a shift register, a driving method thereof, a gate driver circuit and a display device, which can adopt one shift register to drive two rows of gate lines, reduce the number of transistors, reduce the circuit cost, eliminate the noise at output ends of the shift registers, and improve the operation stability.

According to one aspect of this disclosure, a shift register is provided, comprising: a precharge module connected with a first voltage source and a signal input end and configured to provide the voltage of the first voltage source to a first node under the control of an input signal from the signal input end, in which the first node is an output node of the precharge module; a reset module connected with a second voltage source, a reset signal end and the first node and configured to provide the voltage of the second voltage source to the first node under the control of an input signal from the reset signal end; a control module connected with a third voltage source, a fourth voltage source and the first node and configured to provide the voltage from the third voltage source to a second node or provide the voltage from the fourth voltage source to the second node under the control of the voltage of the first node, in which the second node is an output node of the control module; a first pull-up module connected with a first clock signal end, a first signal output end and the first node and configured to provide a clock signal from the first clock signal end to the first signal output end under the control of the voltage of the first node; a second pull-up module connected with the first clock signal end, a second clock signal end, the first node and a second signal output end and configured to provide a clock signal from the second clock signal end to the second signal output end under the control of the clock signal of the first clock signal end and the voltage of the first node; a first pull-down module connected with the fourth voltage source, the first signal output end and the second signal output end and configured to provide the voltage of the fourth voltage source to the first signal output end under the control of an output signal of the second signal output end; and a second pull-down module connected with the fourth voltage source, the second signal output end and the second node and configured to provide the voltage of the fourth voltage source to the second signal output end under the control of the voltage of the second node.

According to one aspect of this disclosure, a gate driver circuit, comprising a plurality of shift registers in series connection, wherein each shift register is the shift register; except the final shift register, a second signal output end of each of the remaining shift registers is connected with a signal input end of the next shift register adjacent to the shift register; except the first shift register, a first signal output end of each of the remaining shift registers is connected with a reset signal end of the previous shift register adjacent to the shift register; in the process of forward scan, a frame start signal is inputted from a signal input end of the first shift register; and in the process of backward scan, the frame start signal is inputted from a rest signal end of the final shift register.

According to one aspect of this disclosure, a display device comprising the gate driver circuit is provided.

According to one aspect of this disclosure, a driving method of a shift register is provided, wherein the shift register includes a precharge module, a reset module, a control module, a first pull-up module, a second pull-up module, a first pull-down module and a second pull-down module; and the driving method comprises: allowing the precharge module to provide the voltage of a first voltage source to an output node of the precharge module under the control of an input signal from a signal input end; allowing the reset module to provide the voltage of a second voltage source to the output node of the precharge module under the control of an input signal from a reset signal end; allowing the control module to provide the voltage from a third voltage source to an output node of the control module or provide the voltage from a fourth voltage source to the output node of the control module under the control of the voltage of the output node of the precharge module; allowing the first pull-up module to provide a clock signal from a first clock signal end to a first signal output end under the control of the voltage of the output node of the precharge module; allowing the second pull-up module to provide a clock signal from a second clock signal end to a second signal output end under the control of the clock signal of the first clock signal end and the voltage of the output node of the precharge module; allowing the first pull-down module to provide the voltage of the fourth voltage source to the first signal output under the control of an output signal of the second signal output end; and allowing the second pull-down module to provide the voltage of the fourth voltage source to the second signal output end under the control of the voltage of the output node of the control module.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Transistors adopted in all the embodiments of the present disclosure may all be thin-film transistors (TFTs), field effect transistors (FETs) or other units with same properties. In the embodiment, the connection means of a drain electrode and a source electrode of each transistor may be exchanged. Therefore, the drain electrodes and the source electrodes of the transistors in the embodiment of the present disclosure actually have no difference. Herein, only for the objective of distinguishing two poles except a gate electrode, one pole is referred to as drain electrode and the other pole is referred to as source electrode.

Figure 1:
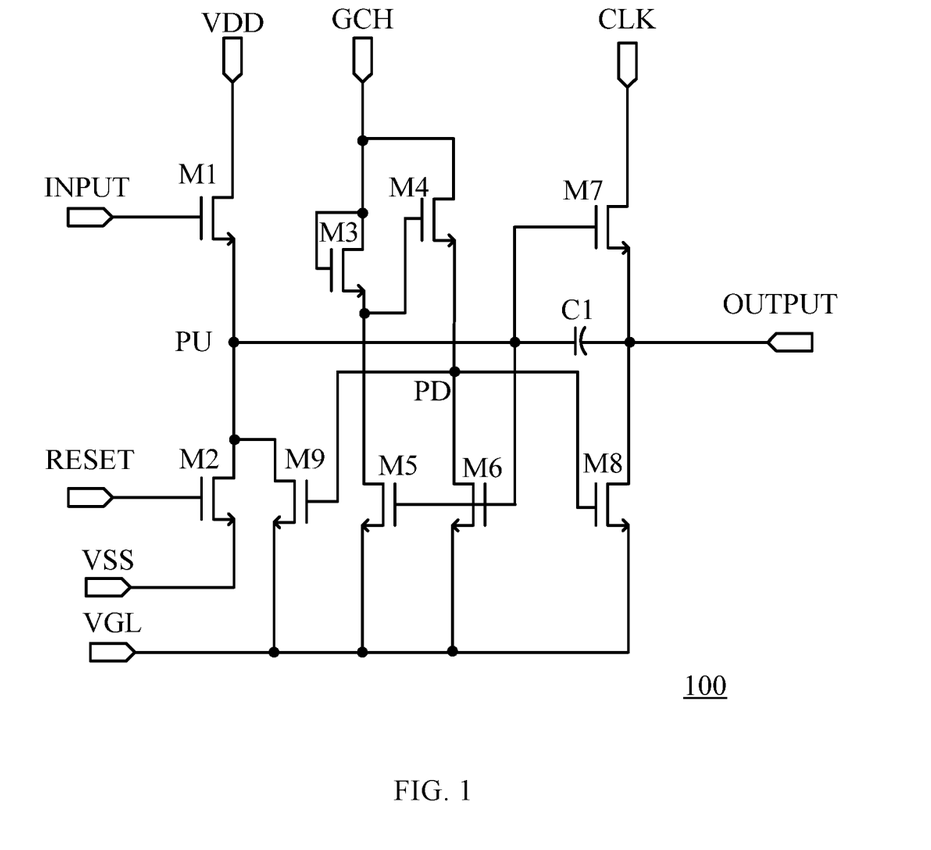
FIG. 1 is a circuit diagram of the traditional shift register.

FIG. 1 is a circuit diagram of the traditional shift register. As illustrated in FIG. 1, the shift register 100 comprises first to ninth transistors M1-M9 and a first capacitor C1, wherein the first transistor M1 is taken as a precharge module; the second transistor M2 is taken as a reset module; the third to sixth transistors M3-M6 are taken as control modules; the seventh transistor M7 and the first capacitor C1 are taken as pull-up modules; the eighth transistor M8 is taken as a pull-down module; and the ninth transistor M9 is taken as a noise reduction module.

The precharge module is connected with a first voltage source VDD and a signal input end INPUT and configured to provide the voltage of the first voltage source VDD to a first node PU under the control of an input signal from the signal input end INPUT, in which the first node PU is an output node of the precharge module.

The reset module is connected with a second voltage source VSS, a reset signal end RESET and the first node PU and configured to provide the voltage of the second voltage source VSS to the first node PU under the control of an input signal from the reset signal end RESET.

The control module is connected with a third voltage source GCH, a fourth voltage source VGL and the first node PU and configured to provide the voltage from the third voltage source GCH to a second node PD or provide the voltage from the fourth voltage source VGL to the second node PD under the control of the voltage of the first node PU, in which the second node PD is an output node of the control module; the third voltage source GCH is a constantly high voltage source; and the fourth voltage source VGL is a constantly low voltage source.

The pull-up module is connected with a clock signal end CLK, a signal output end OUTPUT and the first node PU and configured to provide a clock signal from the clock signal end CLK to the signal output end OUTPUT under the control of the voltage of the first node PU.

The pull-down module is connected with the fourth voltage source VGL, the signal output end OUTPUT and the second node PD and configured to provide the voltage of the fourth voltage source VGL to the signal output end OUTPUT under the control of the voltage of the second node PD.

The noise reduction module is connected with the fourth voltage source VGL, the first node PU and the second node PD, and maintains the first node PU in low level within the non-operating time of the shift register (the time from the completion of the output of one frame to the arrival of the next frame, of the shift register).

Description is given above by taking the case that all the transistors are N-type transistors as an example.

It should be noted that the shift register 100 can perform bilateral scanning. Wherein, in the process of forward scan and backward scan, the structure of the shift register does not change, and only the functions of the signal input end INPUT and the reset signal end RESET are varied. For instance, in the process of forward scan, a high level signal is inputted from the first voltage source VDD and a low level signal is inputted from the second voltage source VSS; and in the process of backward scan, the low level signal is inputted from the first voltage source VDD and the high level signal is inputted from the second voltage source VSS. The signal input end INPUT in forward scan is taken as the reset signal end RESET in backward scan, and the reset signal end RESET in forward scan is taken as the signal input end INPUT in backward scan.

Figure 2:
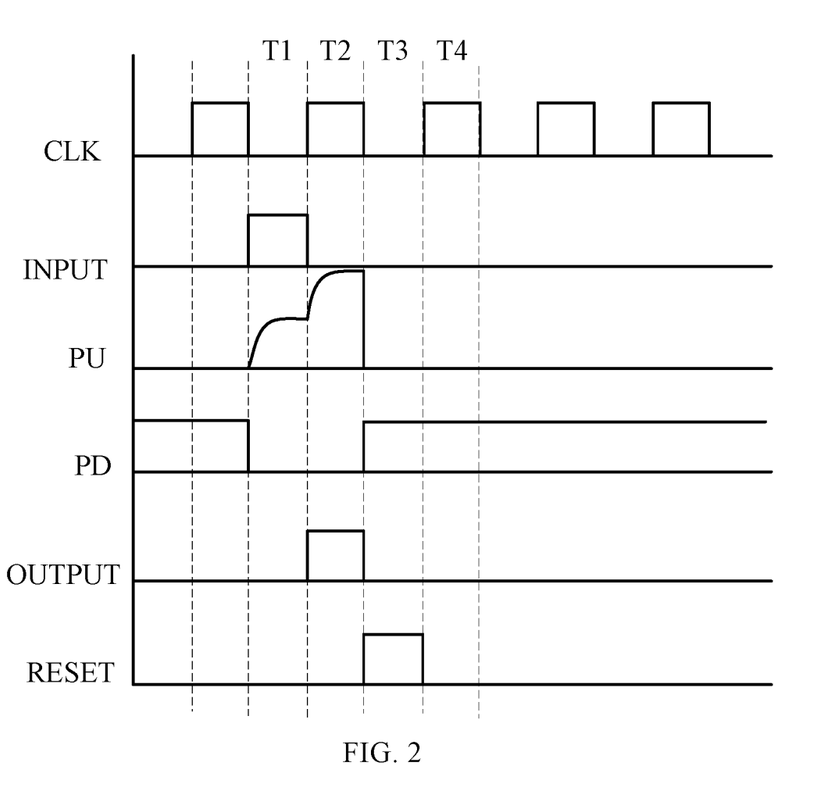
FIG. 2 is a timing diagram of signals in the process of forward scan of the shift register as shown in FIG. 1.

FIG. 2 is a timing diagram of signals in the case of forward scan of the shift register as shown in FIG. 1. Description will be given below to the four working periods of the shift register in FIG. 1 with reference to FIG. 2.

At first period T1, a signal inputted from the signal input end INPUT of the current-stage shift register is an output signal of a signal output end OUTPUT of the previous-stage shift register, is a high level signal at this point, and drives the first transistor M1 to be switched on. A high level signal inputted from the first voltage source VDD charges the first capacitor C1, and the level of the first node PU is pulled up, so that the fifth transistor M5 and the sixth transistor M6 can be switched on. By design of the proportion of the fifth transistor M5 and the sixth transistor M6, the level of the second node PD is low level, so that the eighth transistor M8 and the ninth transistor M9 can be switched off, and hence the signal output end OUTPUT can stably output low level.

At second period T2, the signal inputted from the signal input end INPUT of the current-stage shift register is a low level signal; the first transistor M1 is switched off; the first node PU continuously maintains high level; and the seventh transistor M7 is kept in the conducting state. At this point, the clock signal of the clock signal end CLK is converted into a high level signal, and due to the bootstrap function of the first capacitor C1, the level of the first node PU is pulled up, so the signal output end OUTPUT outputs high level. As the fifth transistor M5 and the sixth transistor M6 are still in the conducting state, the second node PD still maintains low level, and the eighth transistor M8 and the ninth transistor M9 are kept in the off state, so that the signal output end OUTPUT can stably output high level.

At third period T3, a signal output end OUTPUT of the next-stage shift register outputs a high level signal to the reset signal end RESET of the current-stage shift register; the second transistor M2 is switched on; the level of the first node PU is pulled down; the fifth to seventh transistors M5-M7 are switched off; the third voltage source GCH is always in high level; the level of the second node PD is pulled up; the eighth transistor M8 and the ninth transistor M9 are switched on; the second node PU and the signal output end OUTPUT stably output low level; and then the driving of one row of gate lines is completed.

At fourth period T4, the level of the reset signal end RESET is converted into low level; the second transistor M2 is switched off; the first node PU is always in low level and the second node PD is always in high level until the arrival of the next frame; the eighth transistor M8 and the ninth transistor M9 are always in the conducting state; and the second node PU and the signal output end OUTPUT may be continuously subjected to noise reduction, so that the coupled noise voltage produced by the clock signal end CLK can be eliminated, and hence the signal output end OUTPUT can stably output low level.

The traditional shift register can only drive one row of gate lines and requires 9 transistors and 1 capacitor. Each stage of a gate driver circuit formed by the shift registers can only drive one row of gate lines. For the driving of two rows of gate lines, up to 18 transistors and 2 capacitors are required, which is unfavorable for the narrow-bezel design.

A new shift register is provided for solving the problem of the application, in which one shift register can drive two rows of gate lines.

Figure 3:
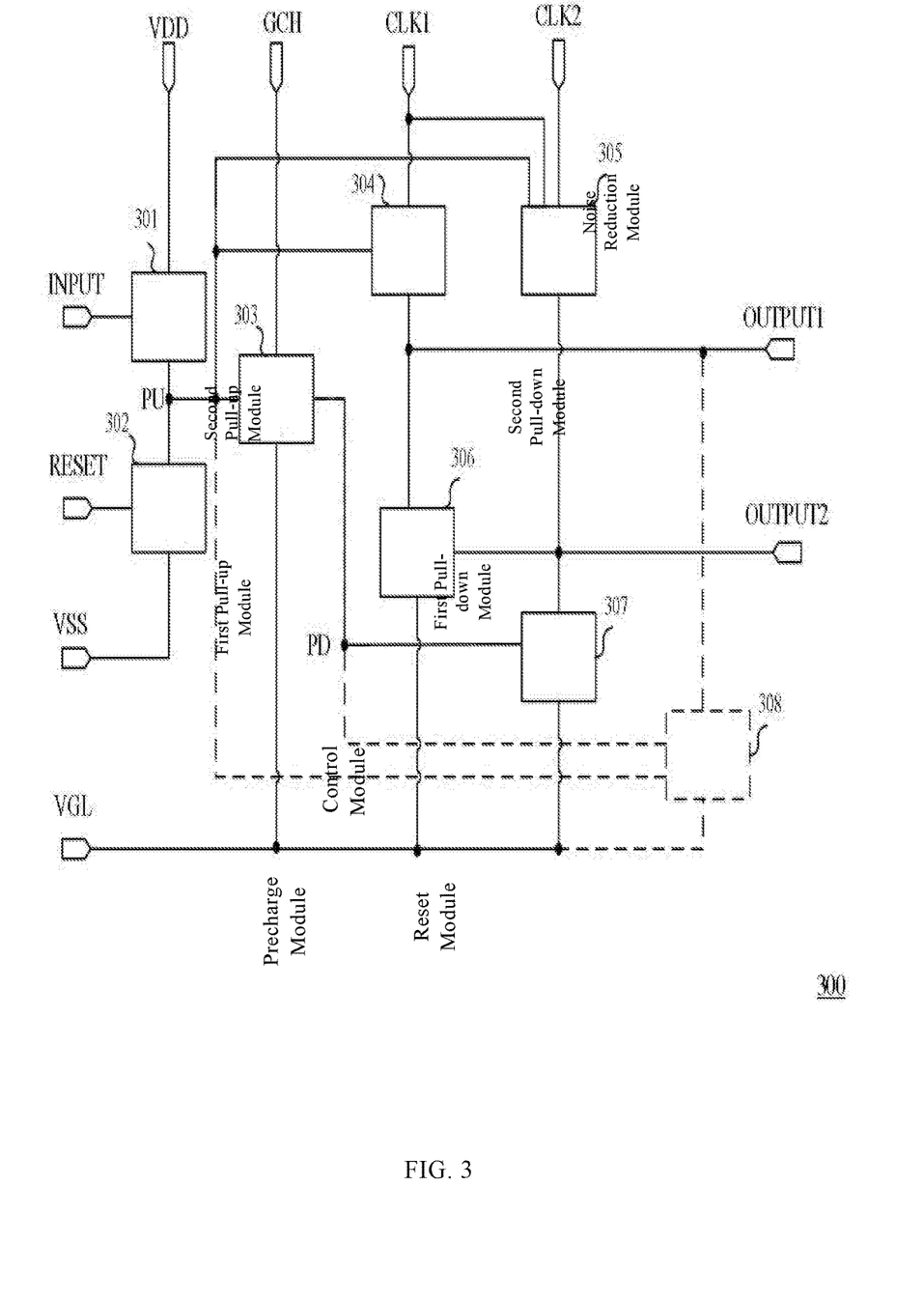
FIG. 3 is a block diagram of a shift register provided by the embodiment of the present disclosure.

FIG. 3 is a block diagram of the shift register provided by the embodiment of the present disclosure. As illustrated in FIG. 3, the shift register 300 comprises:

a precharge module 301 connected with a first voltage source VDD and a signal input end INPUT and configured to provide the voltage of the first voltage source VDD to a first node PU under the control of an input signal from the signal input end INPUT, in which the first node PU is an output node of the precharge module 301;

a reset module 302 connected with a second voltage source VSS, a reset signal end RESET and the first node PU and configured to provide the voltage of the second voltage source VSS to the first node PU under the control of an input signal from the reset signal end RESET;

a control module 303 connected with a third voltage source GCH, a fourth voltage source VGL and the first node PU and configured to provide the voltage from the third voltage source GCH to the second node PD or provide the voltage from the fourth voltage source VGL to the second node PD under the control of the voltage of the first node PU, in which the second node PD is an output node of the control module 303; the third voltage source GCH is a constantly high voltage source; the fourth voltage source VGL is a constantly low voltage source.

a first pull-up module 304 connected with a first clock signal end CLK1, a first signal output end OUTPUT1 and the first node PU and configured to provide a clock signal from the first clock signal end CLK1 to the first signal output end OUTPUT1 under the control of the voltage of the first node PU;

a second pull-up module 305 connected with the first clock signal end CLK1, a second clock signal end CLK2, the first node PU and a second signal output end OUTPUT2 and configured to provide a clock signal from the second clock signal end CLK2 to the second signal output end OUTPUT2 under the control of the clock signal of the first clock signal end CLK1 and the voltage of the first node PU;

a first pull-down module 306 connected with the fourth voltage source VGL, the first signal output end OUTPUT1 and the second signal output end OUTPUT2 and configured to provide the voltage of the fourth voltage source VGL to the first signal output end OUTPUT1 under the control of an output signal of the second signal output end OUTPUT2; and a second pull-down module 307 connected with the fourth voltage source VGL, the second signal output end OUTPUT2 and the second node PD and configured to provide the voltage of the fourth voltage source VGL to the second signal output end OUTPUT2 under the control of the voltage of the second node PD, in which the second pull-down module 307 also maintains the second signal output end OUTPUT2 in low level within the non-operating time of the shift register 300 (the time from the completion of the output of one frame to the arrival of the next frame, of the shift register).

Optionally, as shown in FIG. 3, the shift register 300 further comprises:

a noise reduction module 308 connected with the fourth voltage source VGL, the first signal output end OUTPUT1, the first node PU and the second node PD. The noise simplifier module 308 maintains the first node PU and the first signal output end OUTPUT1 in low level within the non-operating time of the shift register 300.

As can be seen from FIG. 3, the shift register 300 includes two signal output ends and then can drive two rows of gate lines, and meanwhile, ensures that the outputs do not interfere with each other.

Figure 4:
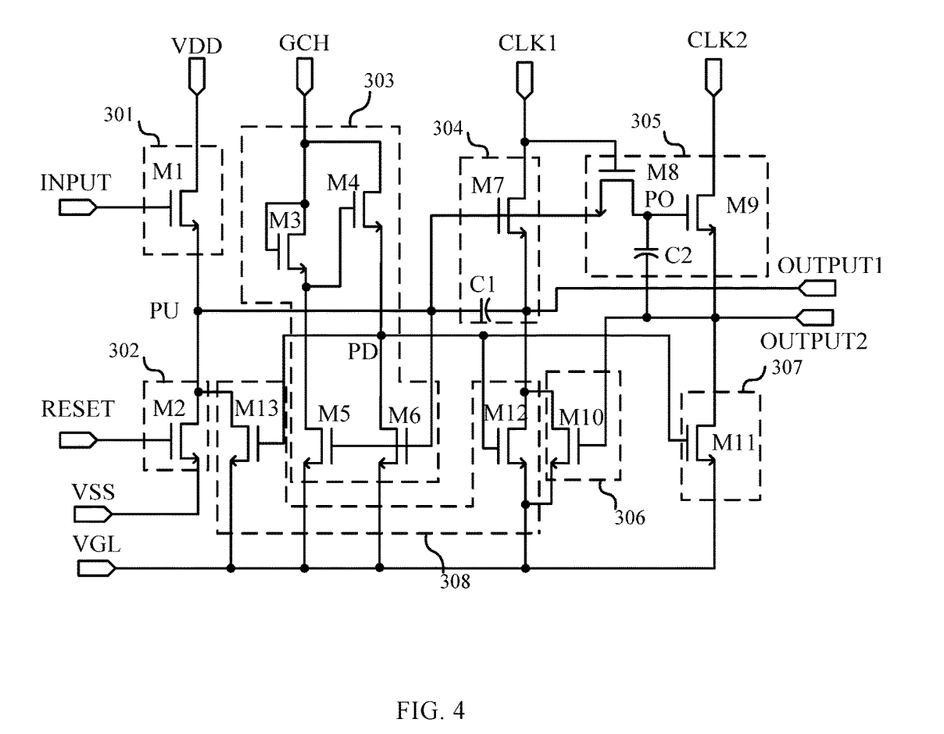
FIG. 4 is a structural circuit diagram of the shift register as shown in FIG. 3 provided by the embodiment of the present disclosure.

FIG. 4 is a structural circuit diagram of the shift register 300 as shown in FIG. 3 provided by the embodiment of the present disclosure.

As shown in FIG. 4, the precharge module 301 includes a first transistor M1; a drain electrode of the first transistor M1 is connected to the first voltage source VDD; a gate electrode is connected to the signal input end INPUT; and a source electrode is connected to the first node PU.

The reset module 302 includes a second transistor M2; a drain electrode of the second transistor M2 is connected to the first node PU; a gate electrode is connected to the reset signal end RESET; and a source electrode is connected to the second voltage source VSS.

The control module 303 includes: a third transistor M3, in which a drain electrode and a gate electrode of the third transistor are connected to the third voltage source GCH; a fourth transistor M4, in which a drain electrode of the fourth transistor is connected to the third voltage source GCH, a gate electrode being connected to a source electrode of the third transistor M3, a source electrode being connected to the second node PD; a fifth transistor M5, in which a drain electrode of the fifth transistor is connected to the source electrode of the third transistor M3, a gate electrode being connected to the first node PU, a source electrode being connected to the fourth voltage source VGL; and a sixth transistor M6, in which a drain electrode of the sixth transistor is connected to the second node PD, a gate electrode being connected to the first node PU, a source electrode being connected to the fourth voltage source VGL.

The first pull-up module 304 includes: a seventh transistor M7, in which a drain electrode of the seventh transistor is connected to the first clock signal end CLK1, a gate electrode being connected to the first node PU, a source electrode being connected to the first signal output end OUTPUT1; and a first capacitor C1 connected between the first node PU and the first signal output end OUTPUT1.

The second pull-up module 305 includes: an eighth transistor M8, in which a gate electrode of the eighth transistor is connected to the first clock signal end CLK1, and a source electrode is connected to the first node PU; a second capacitor C2 connected between a drain electrode of the eighth transistor M8 and the second signal output end OUTPUT2; and a ninth transistor M9, in which a drain electrode of the ninth transistor is connected to the second clock signal end CLK2, a gate electrode being connected to the drain electrode of the eighth transistor M8, a source electrode being connected to the second signal output end OUTPUT2.

The first pull-down module 306 includes a tenth transistor M10, in which a drain electrode of the tenth transistor is connected to the first signal output end OUTPUT1; a gate electrode is connected to the second signal output end OUTPUT2; and a source electrode is connected to the fourth voltage source VGL.

The second pull-down module 307 includes an eleventh transistor M11, in which a drain electrode of the eleventh transistor is connected to the second signal output end OUTPUT2; a gate electrode is connected to the second node PD; and a source electrode is connected to the fourth voltage source VGL.

The noise reduction module 308 includes: a twelfth transistor M12, in which a drain electrode of the twelfth transistor is connected to the first signal output end OUTPUT1, a gate electrode being connected to the second node PD, a source electrode being connected to the fourth voltage source VGL; and a thirteenth transistor M13, in which a drain electrode of the thirteenth transistor is connected to the first node PU, a gate electrode being connected to the second node PD, a source electrode being connected to the fourth voltage source VGL.

The shift register provided by the present disclosure can drive two rows of gate lines by one shift register, reduce the number of the transistors, reduce the circuit cost, eliminate the noise at output ends of the shift registers, and improve the operation stability.

As can be seen from FIG. 4, in order to drive two rows of gate lines, the shift register provided by the application only requires 13 transistors. Compared with the traditional shift register in FIG. 1, 5 transistors are saved. As for a panel which requires the output of more than a thousand rows of gate lines, the adoption of the shift register provided by the application can reduce the use of thousands of transistors, achieve the gate driver function under smaller area, realize narrower bezel, and reduce the cost of the gate driver circuit.

It should be understood that the circuit structure examples of the modules as shown in FIG. 4 are only illustrative, and the modules may also adopt other appropriate circuit structures as long as respective functions can be respectively achieved. No limitation will be given here in the present disclosure.

Figure 5:
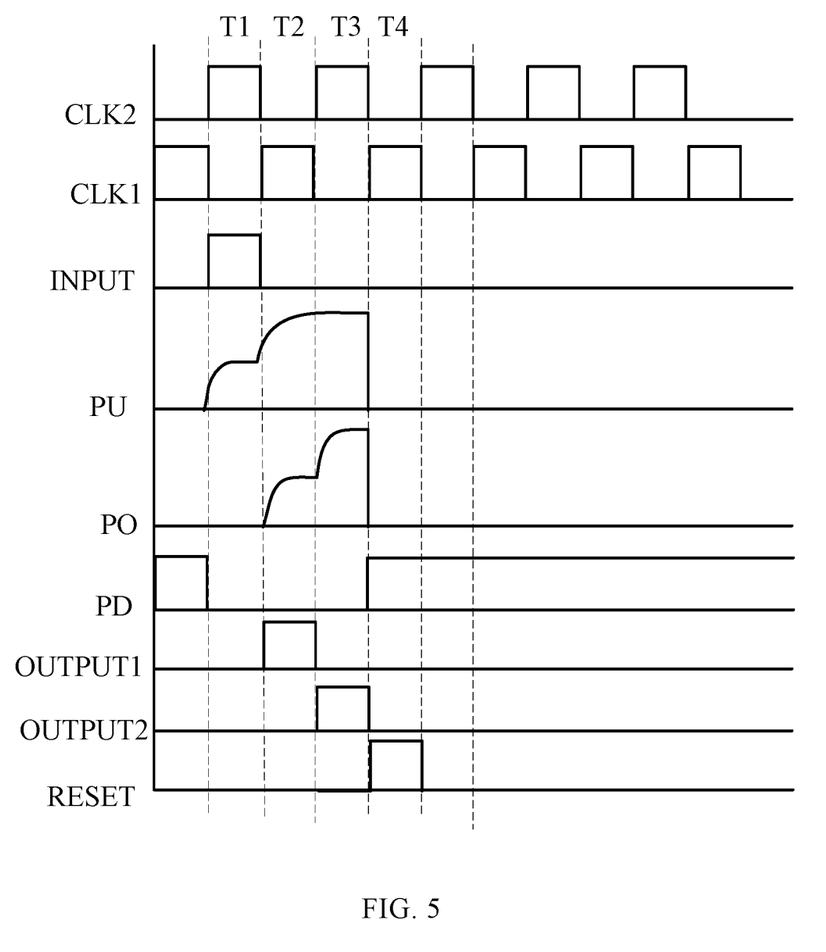
FIG. 5 is a timing diagram of signals in the process of forward scan of the shift register as shown in FIG. 4.

FIG. 5 is a timing diagram of signals in the process of forward scan of the shift register in FIG. 4. Description will be given below to the specific working process of the shift register in FIG. 4, provided by the embodiment of the present disclosure, with reference to FIG. 5. Description will be given below by taking the case that all the above transistors are N-type transistors as an example.

It should be noted that the shift register provided by the present disclosure can perform bilateral scanning. In the process of forward scan and backward scan, the structure of the shift register does not change, and only the functions of the signal input end INPUT and the reset signal end RESET are varied. For instance, in the process of forward scan, a high level signal is inputted from the first voltage source VDD and a low level signal is inputted from the second voltage source VSS; and in the process of backward scan, the low level signal is inputted from the first voltage source VDD and the high level signal is inputted from the second voltage source VSS. The signal input end INPUT in forward scan is taken as the reset signal end RESET in backward scan, and the reset signal end RESET in forward scan is taken as the signal input end INPUT in backward scan.

As shown in FIG. 5, the working process includes the following several periods within the period of one frame. Description will be given below to the working process with reference to FIGS. 4 and 5.

First period T1: a signal inputted from the signal input end INPUT of the current-stage shift register is an output signal of a signal output end OUTPUT of the previous-stage shift register, is a high level signal at this point, and drives the first transistor M1 to be switched on. A high level signal inputted from the first voltage source VDD charges the first capacitor C1, and the level of the first node PU is pulled up, so that the fifth transistor M5 and the sixth transistor M6 can be switched on. By design of the proportion of the fifth transistor M5 and the sixth transistor M6, the level of the second node PD is low level, so that the eleventh to thirteenth transistors M11-M13 can be switched off. At this point, the clock signal outputted from the first clock signal end CLK1 is a low level signal; the eighth transistor M8 and the ninth transistor M9 are switched off; and the first signal output end OUTPUT1 and the second signal output end OUTPUT2 stably output low level.

Second period T2: the signal inputted from the signal input end INPUT of the current-stage shift register is a low level signal; the first transistor M1 is switched off; the first node PU continuously maintains high level; and the seventh transistor M7 is kept in the conducting state. At this point, the clock signal of the clock signal end CLK is converted into a high level signal, so the first signal output end OUTPUT1 outputs high level. Meanwhile, the eighth transistor M8 is switched on, and the first node PU charges the second capacitor C2, so that a third node PO is in high level, and the ninth transistor M9 is switched on. As the clock signal of the second clock signal end CLK2 is a low level signal at this point, the second signal output end OUTPUT2 outputs low level. The tenth transistor M10 is switched off.

Meanwhile, as the fifth transistor M5 and the sixth transistor M6 are still in the conducting state, the second node PD still maintains low level, and the eleventh to thirteenth transistors M11-M13 are kept in the off state, so that the first signal output end OUTPUT1 can stably output high level and the second signal output end OUTPUT2 can stably output low level.

Third period T3: the clock signal of the first clock signal end CLK1 is a low level signal; the clock signal of the second clock signal end CLK2 is a high level signal; as the third node PO is in high level, the ninth transistor M9 is switched on; and the second signal output end OUTPUT2 outputs high level. Meanwhile, the tenth transistor M10 is switched on; the output of the first signal output end OUTPUT1 is pulled to low level; and then the driving of the first row of gate lines is completed.

Fourth period T4: the clock signal of the first clock signal end CLK1 is converted into high level; the eighth transistor M8 is switched on; meanwhile, a first signal output end of the next-stage shift register outputs high level to the reset signal end RESET of the current-stage shift register; the second transistor M2 is switched on; the level of the first node PU and the third node PO is pulled down; the seventh transistor M7 and the ninth transistor M9 are switched off; meanwhile, the fifth transistor M5 and the sixth transistor M6 are also switched off; the level of the second node PD is pulled up by the third voltage source GCH; the eleventh to thirteenth transistors M11-M13 are switched on; both the second signal output end OUTPUT2 and the first signal output end OUTPUT1 stably output low level; and then the driving of the second row of gate lines is completed.

Subsequently, the reset signal end RESET is converted into low level; the second transistor M2 is switched off; before the arrival of the next frame, the first node PU is always in low level and the second node PD is always in high level; the eleventh to thirteenth transistors M11-M13 are always in the conducting state; the first node PU, the first signal output end OUTPUT1 and the second signal output end OUTPUT2 may be continuously subjected to noise reduction; and meanwhile, the first clock signal end CLK1 continuously switches on the eighth transistor M8, so the third node PO may be continuously subjected to noise reduction, and hence the second signal output end OUTPUT2 and the first signal output end OUTPUT1 can stably output low voltage signal. The shift register re-executes the first period after receiving the high level signal of the signal input end INPUT, until the arrival of the next frame.

As can be seen from FIG. 5, the phase of the clock signal of the second clock signal end CLK2 is opposite to the clock signal of the first clock signal end CLK1.

The specific working process in the process of backward scan of the shift register provided by the embodiment of the present disclosure is similar to the working process in the process of forward scan. No further description will be given here.

The present disclosure further provides a driving method of a shift register. Description will be given below to the method with reference to FIG. 4. As shown in FIG. 4, the shift register includes a precharge module 301, a reset module 302, a control module 303, a first pull-up module 304, a second pull-up module 305, a first pull-down module 306 and a second pull-down module 307. The driving method comprises:

allowing the precharge module 301 to provide the voltage of a first voltage source VDD to an output node PU of the precharge module 301 under the control of an input signal from a signal input end INPUT;

allowing the reset module 302 to provide the voltage of a second voltage source VSS to the output node PU of the precharge module 301 under the control of an input signal from a reset signal end;

allowing the control module 303 to provide the voltage from a third voltage source GCH to an output node PD of the control module 303 or provide the voltage from a fourth voltage source VGL to the output node PD of the control module 303 under the control of the voltage of the output node PU of the precharge module 301;

allowing the first pull-up module 304 to provide a clock signal from a first clock signal end CLK1 to a first signal output end OUTPUT1 under the control of the voltage of the output node PU of the precharge module 301;

allowing the second pull-up module 305 to provide a clock signal from a second clock signal end CLK2 to a second signal output end OUTPUT2 under the control of the clock signal of the first clock signal end CLK1 and the voltage of the output node PU of the precharge module 301;

allowing the first pull-down module 306 to provide the voltage of the fourth voltage source VGL to the first signal output OUTPUT1 under the control of an output signal of the second signal output end OUTPUT2; and allowing the second pull-down module 307 to provide the voltage of the fourth voltage source VGL to the second signal output end OUTPUT2 under the control of the voltage of the output node PD of the control module 303.

Figure 6:
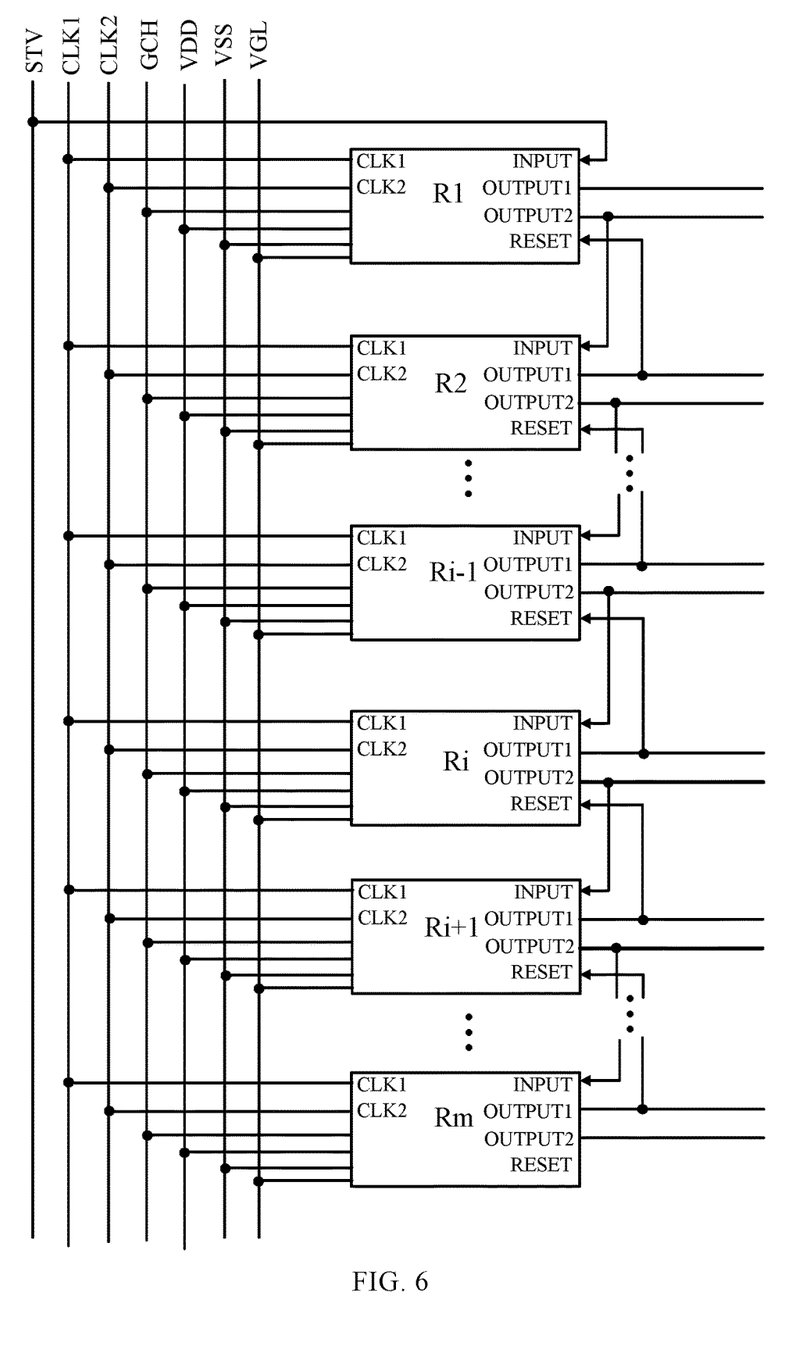
FIG. 6 is a schematic diagram of a gate driver circuit formed by the cascade connection of a plurality of shift registers provided by the embodiment of the present disclosure.

FIG. 6 is a schematic diagram of a gate driver circuit formed by a plurality of shift registers provided by the embodiment of the present disclosure.

As shown in FIG. 6, in a gate driver device, a plurality of shift registers in FIG. 4 are in series connection. Wherein, except the final shift register Rm, a second signal output end OUTPUT2 of each of the remaining shift registers Ri($1 \leq i < m$) is connected with a signal input end INPUT of the next shift register Ri+1 adjacent to the shift register Ri; and except the first shift register R1, a first signal output end OUTPUT1 of each of the remaining shift registers Ri ($1 < i \leq m$) is connected with a reset signal end RESET of the previous shift register Ri−1 adjacent to the shift register Ri. In the process of forward scan, a frame start signal STV is inputted from a signal input end INPUT of the first shift register R1; and in the process of backward scan, the frame start signal STV is inputted from a rest signal end RESET of the final shift register Rm.

As shown in FIG. 6, in the gate driver circuit, clock signals inputted from first clock signal ends of the shift registers in two adjacent stages are same, and clock signals inputted from second clock signal ends are same.

The specific working process of the shift registers in the process of forward scan in the gate driver circuit provided by the embodiment of the present disclosure is similar to the working process as described in FIGS. 4 and 5. No further description will be given here.

The specific working process in the process of backward scan of the gate driver circuit provided by the embodiment of the present disclosure is similar to the working process in the process of forward scan. No further description will be given here.

The gate driver circuit provided by the embodiment of the present disclosure may adopt the GOA technology and be taken as a gate driver circuit of a display device to provide progressive scanning function and transmit scanning signals to a display region.

The gate driver circuit provided by the embodiment of the present disclosure may reduce the number of transistors, reduce the circuit cost, eliminate the noise at output ends, and improve the operation stability.

The present disclosure further provides a display device comprising the gate driver circuit.

The display device herein may be: any product or component with display function such as e-paper, a mobile phone, a tablet PC, a TV, a display, a notebook computer, a digital picture frame and a navigator.

The foregoing is only the preferred embodiments of the present disclosure and not intended to limit the scope of protection of the present disclosure. Any change or replacement that may be easily thought of by those skilled within the technical scope disclosed by the present disclosure shall fall within the scope of protection of the present disclosure. Therefore, the scope of protection of the present disclosure shall be defined by the appended claims.

The present application claims the priority of the Chinese Patent Application No. 201610078430.4 filed on Feb. 4, 2016, which is incorporated herein in its entirety by reference as part of the disclosure of the present application.

The invention claimed is:

1. A shift register, comprising:
a precharge module connected with a first voltage source and a signal input end and configured to provide the voltage of the first voltage source to a first node under the control of an input signal from the signal input end, in which the first node is an output node of the precharge module;
a reset module connected with a second voltage source, a reset signal end and the first node and configured to provide the voltage of the second voltage source to the first node under the control of an input signal from the reset signal end;
a control module connected with a third voltage source, a fourth voltage source and the first node and configured to provide the voltage from the third voltage source to a second node or provide the voltage from the fourth voltage source to the second node under the control of the voltage of the first node, in which the second node is an output node of the control module;
a first pull-up module connected with a first clock signal end, a first signal output end and the first node and configured to provide a clock signal from the first clock signal end to the first signal output end under the control of the voltage of the first node;
a second pull-up module connected with the first clock signal end, a second clock signal end, the first node and a second signal output end and configured to provide a clock signal from the second clock signal end to the second signal output end under the control of the clock signal of the first clock signal end and the voltage of the first node;
a first pull-down module connected with the fourth voltage source, the first signal output end and the second signal output end and configured to provide the voltage of the fourth voltage source to the first signal output end under the control of an output signal of the second signal output end; and
a second pull-down module connected with the fourth voltage source, the second signal output end and the second node and configured to provide the voltage of the fourth voltage source to the second signal output end under the control of the voltage of the second node.

2. The shift register according to claim 1, further comprising:

a noise reduction module connected with the fourth voltage source, the first signal output end, the first node and the second node.

3. The shift register according to claim 1, wherein the precharge module includes:
a first transistor, in which a drain electrode of the first transistor is connected to the first voltage source; a gate electrode is connected to the signal input end; and a source electrode is connected to the first node.

4. The shift register according to claim 1, wherein the reset module includes:
a second transistor, in which a drain electrode of the second transistor is connected to the first node; a gate electrode is connected to the reset signal end; and a source electrode is connected to the second voltage source.

5. The shift register according to claim 1, wherein the control module includes:
a third transistor, in which a drain electrode and a gate electrode of the third transistor are connected to the third voltage source;
a fourth transistor, in which a drain electrode of the fourth transistor is connected to the third voltage source, a gate electrode being connected to a source electrode of the third transistor, a source electrode being connected to the second node;
a fifth transistor, in which a drain electrode of the fifth transistor is connected to the source electrode of the third transistor, a gate electrode being connected to the first node, a source electrode being connected to the fourth voltage source; and
a sixth transistor, in which a drain electrode of the sixth transistor is connected to the second node, a gate electrode being connected to the first node, a source electrode being connected to the fourth voltage source.

6. The shift register according to claim 1, wherein the first pull-up module includes:
a seventh transistor, in which a drain electrode of the seventh transistor is connected to the first clock signal end, a gate electrode being connected to the first node, a source electrode being connected to the first signal output end; and
a first capacitor connected between the first node and the first signal output end.

7. The shift register according to claim 1, wherein the second pull-up module includes:
an eighth transistor, in which a gate electrode of the eighth transistor is connected to the first clock signal end, and a source electrode is connected to the first node;
a second capacitor connected between a drain electrode of the eighth transistor and the second signal output end; and
a ninth transistor, in which a drain electrode of the ninth transistor is connected to the second clock signal end, a gate electrode being connected to the drain electrode of the eighth transistor, a source electrode being connected to the second signal output end.

8. The shift register according to claim 1, wherein the first pull-down module includes:
a tenth transistor, in which a drain electrode of the tenth transistor is connected to the first signal output end; a gate electrode is connected to the second signal output end; and a source electrode is connected to the fourth voltage source.

9. The shift register according to claim 1, wherein the second pull-down module includes:

an eleventh transistor, in which a drain electrode of the eleventh transistor is connected to the second signal output end; a gate electrode is connected to the second node; and a source electrode is connected to the fourth voltage source.

10. The shift register according to claim 2, wherein the noise reduction module includes:
   a twelfth transistor, in which a drain electrode of the twelfth transistor is connected to the first signal output end, a gate electrode being connected to the second node, a source electrode being connected to the fourth voltage source; and
   a thirteenth transistor, in which a drain electrode of the thirteenth transistor is connected to the first node, a gate electrode being connected to the second node, a source electrode being connected to the fourth voltage source.

11. The shift register according to claim 1, wherein
   in the process of forward scan, the first voltage source outputs a high level signal, and the second voltage source outputs a low level signal;
   in the process of backward scan, the first voltage source outputs a low level signal, and the second voltage source outputs a high level signal; and
   the signal input end in forward scan is taken as the reset signal end in backward scan, and the reset signal end in forward scan is taken as the signal input end in backward scan.

12. The shift register according to claim 3, wherein all the transistors are N-type transistors.

13. The shift register according to claim 1, wherein the phase of the clock signal of the second clock signal end is opposite to the clock signal of the first clock signal end.

14. The shift register according to claim 1, wherein the third voltage source is a constantly high voltage source, and the fourth voltage source is a constantly low voltage source.

15. A gate driver circuit, comprising a plurality of shift registers in series connection, wherein each shift register is the shift register according to claim 1;
   except the final shift register, a second signal output end of each of the remaining shift registers is connected with a signal input end of the next shift register adjacent to the shift register; except the first shift register, a first signal output end of each of the remaining shift registers is connected with a reset signal end of the previous shift register adjacent to the shift register;
   in the process of forward scan, a frame start signal is inputted from a signal input end of the first shift register; and in the process of backward scan, the frame start signal is inputted from a rest signal end of the final shift register.

16. The gate driver circuit according to claim 15, wherein clock signals inputted from first clock signal ends of the shift registers in two adjacent stages are same, and clock signals inputted from second clock signal ends are same.

17. A display device comprising the gate driver circuit according to claim 15.

18. A driving method of a shift register, wherein the shift register includes a precharge module, a reset module, a control module, a first pull-up module, a second pull-up module, a first pull-down module and a second pull-down module; and the driving method comprises:
   allowing the precharge module to provide the voltage of a first voltage source to an output node of the precharge module under the control of an input signal from a signal input end;
   allowing the reset module to provide the voltage of a second voltage source to the output node of the precharge module under the control of an input signal from a reset signal end;
   allowing the control module to provide the voltage from a third voltage source to an output node of the control module or provide the voltage from a fourth voltage source to the output node of the control module under the control of the voltage of the output node of the precharge module;
   allowing the first pull-up module to provide a clock signal from a first clock signal end to a first signal output end under the control of the voltage of the output node of the precharge module;
   allowing the second pull-up module to provide a clock signal from a second clock signal end to a second signal output end under the control of the clock signal of the first clock signal end and the voltage of the output node of the precharge module;
   allowing the first pull-down module to provide the voltage of the fourth voltage source to the first signal output under the control of an output signal of the second signal output end; and
   allowing the second pull-down module to provide the voltage of the fourth voltage source to the second signal output end under the control of the voltage of the output node of the control module.

* * * * *